(12) United States Patent
Sedighi et al.

(10) Patent No.: US 11,962,317 B2
(45) Date of Patent: Apr. 16, 2024

(54) NOISE SHAPING IN MULTI-STAGE ANALOG-TO-DIGITAL CONVERTERS

(71) Applicant: QUALCOMM Incorporated, San Diego, CA (US)

(72) Inventors: Behnam Sedighi, La Jolla, CA (US); Shi Bu, Los Angeles, CA (US); Elias Dagher, Laguna Niguel, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 142 days.

(21) Appl. No.: 17/804,779

(22) Filed: May 31, 2022

(65) Prior Publication Data

US 2023/0387929 A1    Nov. 30, 2023

(51) Int. Cl.
*H03M 1/08* (2006.01)

(52) U.S. Cl.
CPC ................... *H03M 1/0854* (2013.01)

(58) Field of Classification Search
CPC ........ H03M 1/08; H03M 1/426; H03M 1/468; H03M 1/164
See application file for complete search history.

(56) References Cited

U.S. PATENT DOCUMENTS

| | | | | |
|---|---|---|---|---|
| 5,936,562 A * | 8/1999 | Brooks | ................... | H03M 3/46 341/143 |
| 5,982,313 A * | 11/1999 | Brooks | ................. | H03M 1/145 341/143 |
| 7,456,766 B2 * | 11/2008 | Keehr | ................. | H03M 7/3006 341/131 |
| 8,884,797 B2 * | 11/2014 | Peng | .................... | G09G 3/3688 341/172 |
| 9,698,805 B1 * | 7/2017 | Bandyopadhyay | ......................... | H03M 1/0626 |
| 10,340,932 B2 * | 7/2019 | Bandyopadhyay | ... | H03M 3/426 |
| 10,432,210 B1 * | 10/2019 | Yendluri | ............ | H03M 1/1245 |
| 10,536,161 B1 * | 1/2020 | Zhang | ................. | H03M 3/458 |
| 10,644,718 B1 * | 5/2020 | Wang | .................... | H04B 1/0021 |
| 11,784,653 B2 * | 10/2023 | Zhao | ..................... | H03M 1/145 341/120 |

(Continued)

OTHER PUBLICATIONS

Oh S., et al., "An 85 dB DR 4 MHz BW Pipelined Noise-Shaping SAR ADC with 1-2 MASH Structure," IEEE Journal of Solid-State Circuits, vol. 56, No. 11, Nov. 2021, pp. 3424-3433.

(Continued)

*Primary Examiner* — Lam T Mai
(74) *Attorney, Agent, or Firm* — Patterson + Sheridan, L.L.P.

(57) ABSTRACT

Methods and apparatus for noise shaping in multi-stage analog-to-digital converters (ADCs). An example ADC generally includes a first conversion stage having a residue output; an amplifier having an input selectively coupled to the residue output of the first conversion stage; a second conversion stage having an input selectively coupled to an output of the amplifier; and a switched-capacitor network having a first port coupled to the input of the amplifier and having a second port coupled to the input of the second conversion stage, the switched-capacitor network being configured to provide a second-order or higher noise transfer function for noise shaping of quantization noise of the second conversion stage.

29 Claims, 10 Drawing Sheets

(56) References Cited

U.S. PATENT DOCUMENTS

| | | | | |
|---|---|---|---|---|
| 2005/0093726 | A1* | 5/2005 | Hezar | H03M 3/412 |
| | | | | 341/143 |
| 2006/0176197 | A1* | 8/2006 | McNeill | H03M 1/1004 |
| | | | | 341/120 |
| 2006/0284751 | A1* | 12/2006 | San | H03M 3/34 |
| | | | | 341/143 |
| 2009/0021409 | A1* | 1/2009 | Mathe | H03M 3/374 |
| | | | | 327/170 |
| 2010/0141492 | A1* | 6/2010 | Lin | H03M 1/1004 |
| | | | | 341/120 |
| 2011/0211842 | A1* | 9/2011 | Agazzi | H04B 3/235 |
| | | | | 398/141 |
| 2012/0044927 | A1* | 2/2012 | Pan | H03M 3/47 |
| | | | | 370/345 |
| 2012/0086589 | A1* | 4/2012 | Haroun | H03M 3/344 |
| | | | | 341/119 |
| 2012/0086590 | A1* | 4/2012 | Satarzadeh | H03M 3/464 |
| | | | | 341/120 |
| 2015/0171886 | A1* | 6/2015 | Kinyua | H04L 25/03261 |
| | | | | 341/150 |
| 2016/0134300 | A1* | 5/2016 | Wang | H03M 1/42 |
| | | | | 341/172 |
| 2016/0182075 | A1* | 6/2016 | Devarajan | H03M 1/121 |
| | | | | 341/120 |
| 2016/0301403 | A1* | 10/2016 | Cassagnes | H03M 1/1245 |
| 2017/0085349 | A1* | 3/2017 | Ho | H04B 1/123 |
| 2018/0309458 | A1* | 10/2018 | Bandyopadhyay | H03M 1/804 |
| 2019/0280705 | A1* | 9/2019 | Bodnar | H03M 1/802 |
| 2021/0376844 | A1* | 12/2021 | Wang | H03M 1/1265 |
| 2021/0384874 | A1* | 12/2021 | Sun | H03F 1/0227 |
| 2022/0038064 | A1* | 2/2022 | Kareppagoudr | H03F 1/0216 |
| 2022/0255553 | A1* | 8/2022 | Zhao | G04F 10/005 |
| 2023/0387929 | A1* | 11/2023 | Sedighi | H03M 1/164 |

OTHER PUBLICATIONS

Song Y., et al., "A 12.5-MHz Bandwidth 77-dB SNDR SAR-Assisted Noise Shaping Pipeline ADC," IEEE Journal of Solid-State Circuits, vol. 55, No. 2, Feb. 2020, pp. 312-321.

Song Y., et al., "A 40-MHz Bandwidth 75-dB SNDR Partial-Interleaving SAR-Assisted Noise-Shaping Pipeline ADC," IEEE Journal of Solid-State Circuits, vol. 56, No. 6, Jun. 2021, pp. 1772-1783.

Zhang Y., et al., "A 79.1dB-SNDR 20MHz-BW 2nd-Order SAR-Assisted Noise-Shaping Pipeline ADC with Gain and Offset Background Calibrations Based on Convergence Enhanced Split-Over-Time Architecture," 2021 IEEE Custom Integrated Circuits Conference (CICC), Apr. 2021, pp. 1-2.

Abo A.M., et al., "A 1.5-V, 10-bit, 14.3-MS/s CMOS Pipeline Analog-to-Digital Converter", IEEE Journal of Solid-State Circuits, vol. 34, No. 5, May 1, 1999, USA, pp. 599-606, XP011060991, ISSN: 0018-9200, Section II, Figures 2,3.

International Search Report and Written Opinion—PCT/US2023/019639—ISA/EPO—dated Aug. 25, 2023.

Zhang Y., et al., "A 20 MHZ Bandwidth 79 dB SNDR SAR-Assisted Noise-Shaping Pipeline ADC With Gain and Offset Calibrations", IEEE Journal of Solid-State Circuits, vol. 57, No. 3, Mar. 2022, Jan. 5, 2022, pp. 745-756, XP093073200, USA, ISSN: 0018-9200, DOI: 10.1109/JSSC.2021.3137342, Abstract, Section IV.C, figures 4, 13,16.

\* cited by examiner

700

A METHOD OF ANALOG-TO-DIGITAL CONVERSION USING AN ANALOG-TO-DIGITAL CONVERTER (ADC) COMPRISING A FIRST CONVERSION STAGE, A SECOND CONVERSION STAGE, AN AMPLIFIER SELECTIVELY COUPLED BETWEEN THE FIRST CONVERSION STAGE AND THE SECOND CONVERSION STAGE, AND A SWITCHED-CAPACITOR NETWORK COUPLED BETWEEN AN INPUT OF THE AMPLIFIER AND AN INPUT OF THE SECOND CONVERSION STAGE

702

COUPLE, DURING A CONVERSION PHASE OF THE ADC, A FIRST CAPACITIVE ELEMENT OF THE SWITCHED-CAPACITOR NETWORK IN PARALLEL WITH A CAPACITIVE ELEMENT ASSOCIATED WITH THE SECOND CONVERSION STAGE

704

COUPLE, DURING AN AMPLIFICATION PHASE OF THE ADC, THE FIRST CAPACITIVE ELEMENT BETWEEN THE INPUT OF THE AMPLIFIER AND AN OUTPUT OF THE AMPLIFIER

FIG. 7

NOISE SHAPING IN MULTI-STAGE ANALOG-TO-DIGITAL CONVERTERS

TECHNICAL FIELD

Certain aspects of the present disclosure generally relate to electronic circuits and, more particularly, to techniques and apparatus for noise shaping in multi-stage analog-to-digital converters (ADCs).

BACKGROUND

Electronic devices include computing devices such as desktop computers, notebook computers, tablet computers, smartphones, wearable devices like a smartwatch, Internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

Wireless devices in these and other communication systems may include one or more analog-to-digital converters (ADCs), for converting received, amplified, filtered, and downconverted analog signals to digital signals for additional signal processing in the digital domain, for example. Several types of ADCs are available, some more suitable for particular applications than others. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a "flash ADC" may provide a faster conversion speed at the cost of an exponential increase in power and area consumption compared to a SAR ADC. Another type of ADC with faster sampling rates than SAR ADCs, but lower power and area consumption than flash ADCs is referred to as a "pipelined ADC."

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include increased noise-shaping flexibility in a multi-stage analog-to-digital converter (ADC), increased dynamic range, increased operating speed of the ADC or lower power consumption, and reduced lateral area (e.g., footprint) of the ADC compared to some other ADC topologies.

Certain aspects of the present disclosure provide an ADC. The ADC generally includes a first conversion stage having a residue output; an amplifier having an input selectively coupled to the residue output of the first conversion stage; a second conversion stage having an input selectively coupled to an output of the amplifier; and a switched-capacitor network having a first port coupled to the input of the amplifier and having a second port coupled to the input of the second conversion stage, the switched-capacitor network being configured to provide a second-order or higher noise transfer function for noise shaping of quantization noise of the second conversion stage.

Certain aspects of the present disclosure provide an ADC. The ADC generally includes a first conversion stage having a residue output; an amplifier having an input selectively coupled to the residue output of the first conversion stage; a second conversion stage having an input selectively coupled to an output of the amplifier; and a switched-capacitor network having a first port coupled to the input of the amplifier and having a second port coupled to the input of the second conversion stage, the switched-capacitor network having a first capacitive element having a first terminal coupled to the second port and having a second terminal selectively coupled to a reference potential node of the ADC and selectively coupled to the first port.

Certain aspects of the present disclosure provide a wireless device. The wireless device includes the ADC as described herein, one or more antennas, and one or more receive paths coupled between the one or more antennas and one or more inputs of the ADC.

Certain aspects of the present disclosure provide a method of analog-to-digital conversion using an ADC generally including a first conversion stage, a second conversion stage, an amplifier selectively coupled between the first conversion stage and the second conversion stage, and a switched-capacitor network coupled between an input of the amplifier and an input of the second conversion stage. The method generally includes coupling, during a conversion phase of the ADC, a first capacitive element of the switched-capacitor network in parallel with a capacitive element associated with the second conversion stage, and coupling, during an amplification phase of the ADC, the first capacitive element between the input of the amplifier and an output of the amplifier.

Certain aspects of the present disclosure provide an ADC. The ADC generally includes first means for converting an analog input signal to a first digital output signal, means for amplifying a residue from the first means for converting, second means for converting the amplified residue to a second digital output signal, and means for providing a second-order or higher noise transfer function for noise shaping of quantization noise of the second means for converting.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 7 is a flow diagram of example operations for analog-to-digital conversion, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to techniques and apparatus for noise shaping in a multi-stage analog-to-digital converter (ADC) (e.g., a pipelined ADC), in order to push the quantization error and some portion of the circuit noise outside of the signal band, and thereby increase the dynamic range of the ADC. A switched-capacitor network may be implemented in the last stage of the multi-stage ADC to produce second-order (or greater) delay for noise shaping. For certain aspects, a capacitive element may be used: (1) as a feedback capacitor during interstage amplification, (2) for reference scaling during quantization of the last stage, and (3) for saving the residue at the end of quantization.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
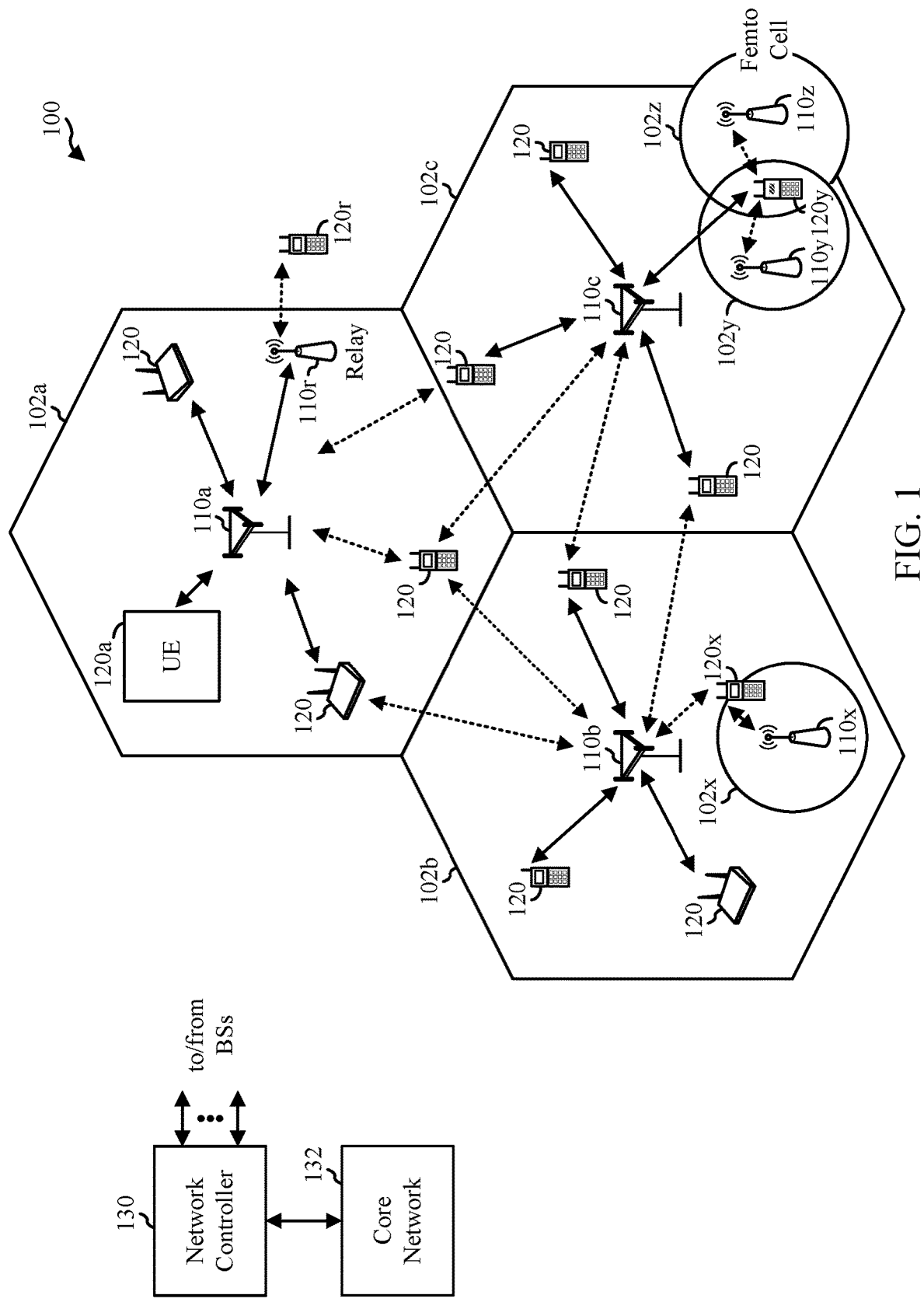
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a*-*z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a multi-stage analog-to-digital converter (ADC) with improved noise shaping, as described herein.

Figure 2:
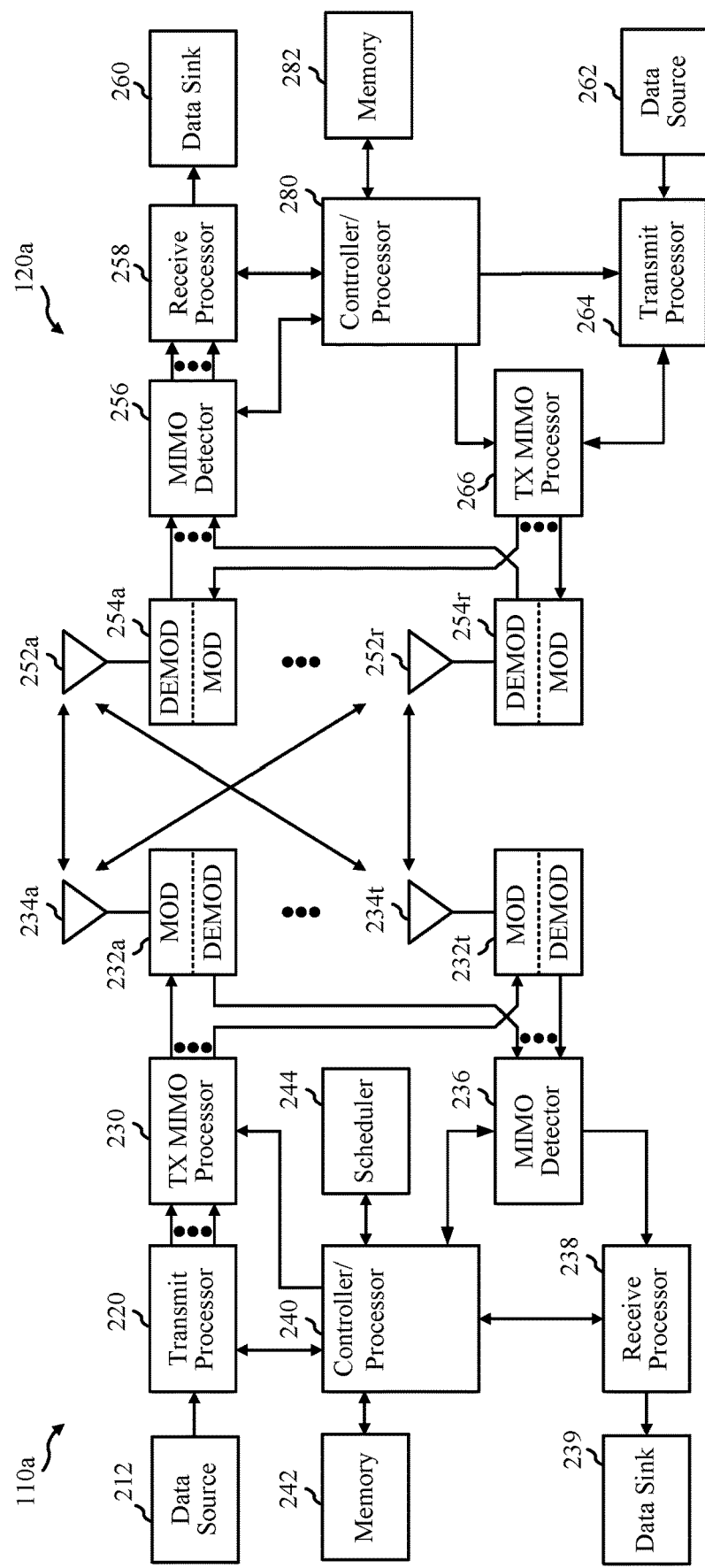
FIG. 2 is a block diagram conceptually illustrating a design of an example a base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from all the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include a multi-stage ADC with improved noise shaping, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
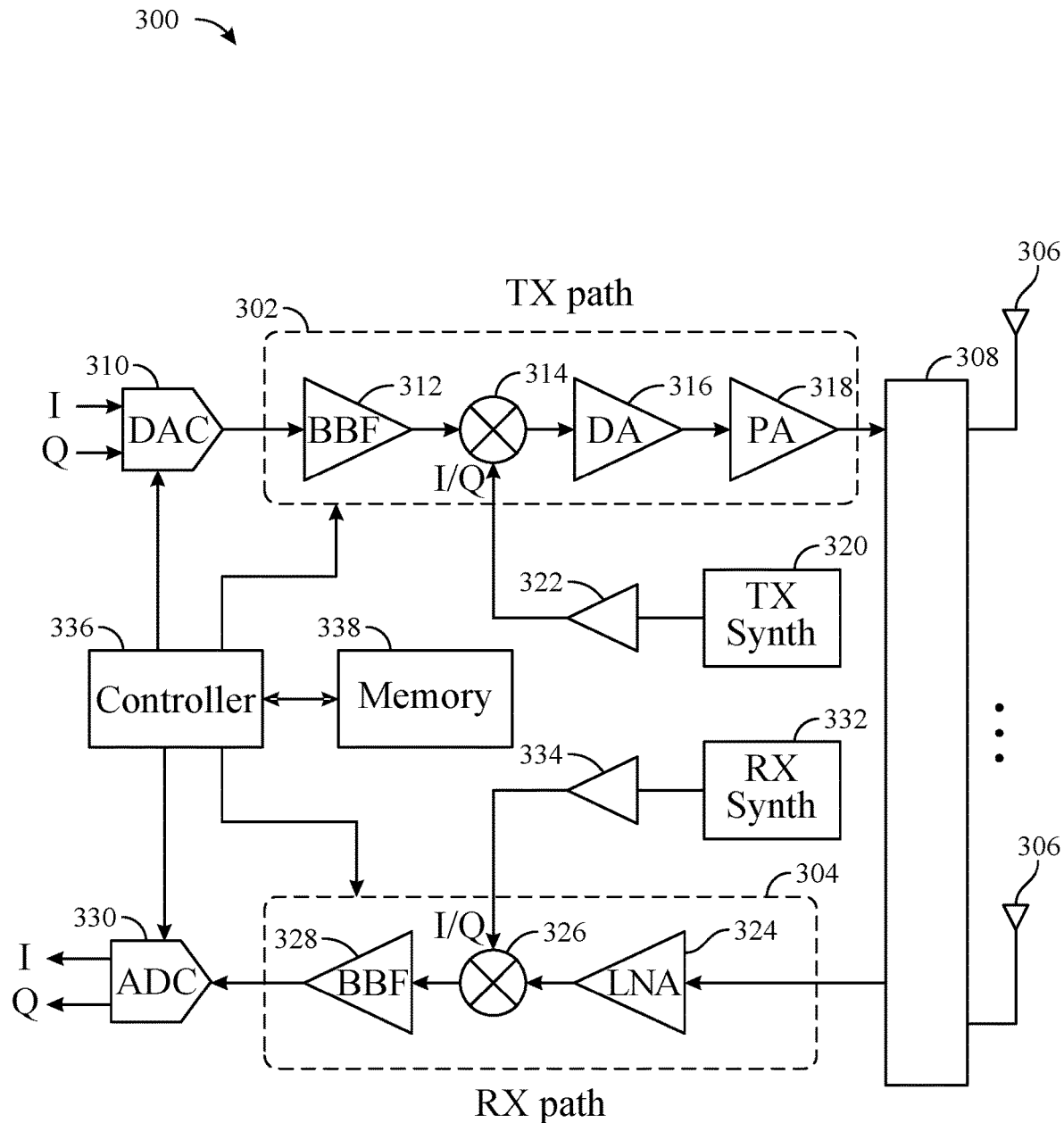
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

For certain aspects, the ADC 330 may be implemented by any of various suitable high-speed ADC topologies, such as a pipelined ADC or other multi-stage ADC. For certain aspects, the ADC 330 may be implemented with improved noise shaping to push the quantization error and some portion of the circuit noise outside of the signal band, as described in more detail below.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for analog-to-digital conversion in any of various other suitable systems (e.g., video or image processing).

Example Noise Shaping in Multi-Stage Analog-to-Digital Converters

Pipelined analog-to-digital converters (ADCs) and other multi-stage ADCs may be used for high-speed and power-efficient analog-to-digital conversion in a device (e.g., a 5th Generation (5G) transceiver in a receive chain of a transceiver front end, such as the RF transceiver circuit 300 of FIG. 3). The pipelined ADC may be used, for example, with sampling rates from a few megasamples per second (Msps) to a thousand or so Msps and higher.

Figure 4:
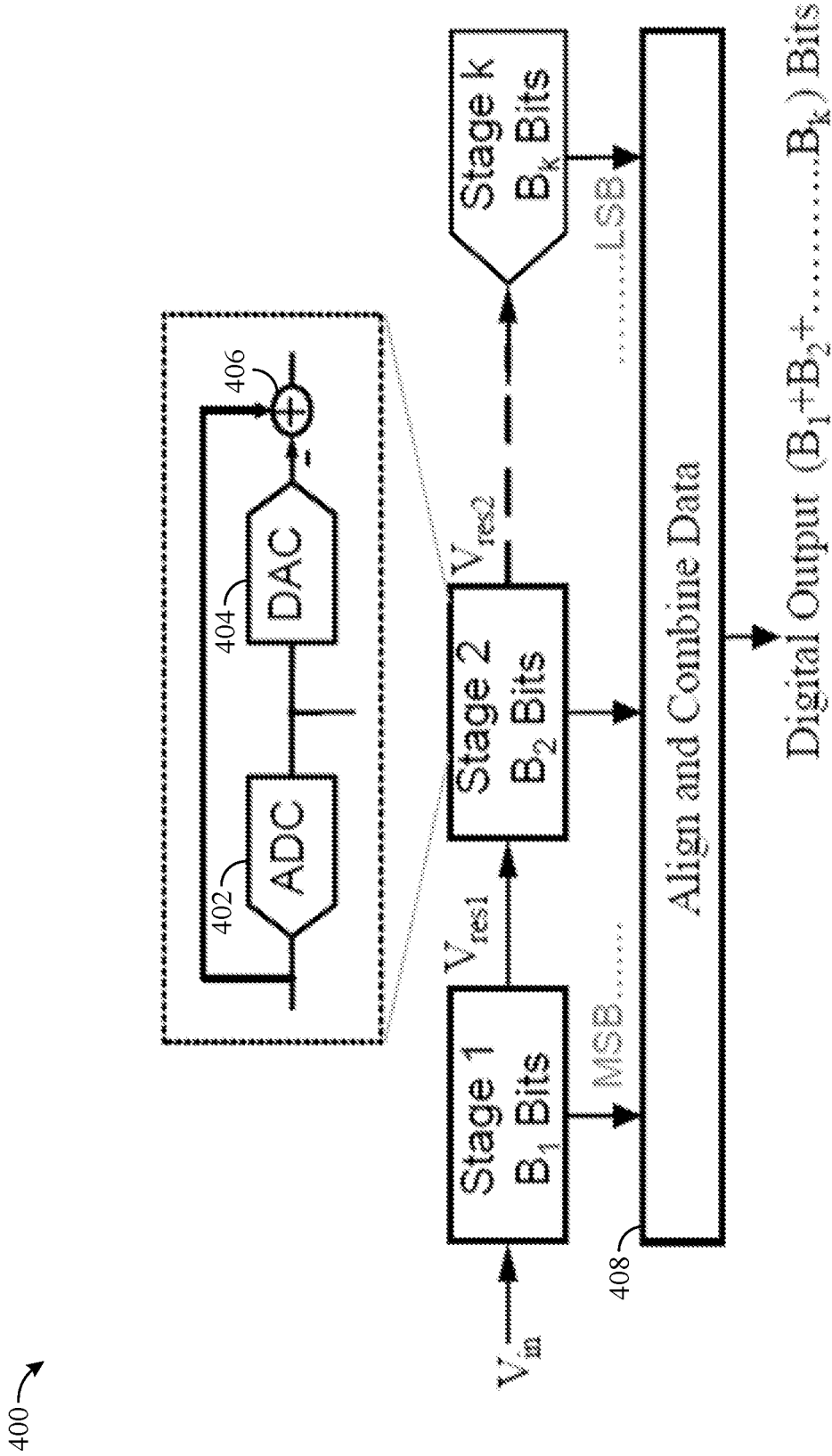
FIG. 4 is a block diagram of an example multi-stage analog-to-digital converter (ADC), in which aspects of the present disclosure may be practiced.

FIG. 4 is a block diagram of an example multi-stage ADC 400. As illustrated, each stage of the pipelined ADC 400 includes at least an ADC 402, a digital-to-analog converter (DAC) 404, and an analog combiner 406. The ADC 402 may be a relatively low-resolution ADC, and may be implemented by a flash ADC or any other suitable type of ADC.

The ADC 402 has one or more input nodes for receiving one or more analog inputs. The one or more analog inputs may include a residue output of a preceding stage of the ADC 400 after quantization. Although illustrated with a single input node, in some cases the ADC 402 may alternatively be implemented with a pair of differential input nodes. The ADC 402 generates a digital output (e.g., an output for the corresponding stage) based on the analog input(s). Having an input coupled to an output of the ADC 402, the DAC 404 receives the digital output signal of the ADC 402 as an input signal. The DAC 404 regenerates the received digital input from the ADC 402 into an analog voltage. Although illustrated with a single output node, the DAC 404 may alternatively be implemented with a pair of differential output nodes. The analog combiner 406 may then output a voltage difference between the analog input(s) to the stage and the analog output(s) from the DAC 404. This voltage difference is referred to as a residue voltage of a given stage, and may be used as an input for the following stage of the ADC 400. Thus, each stage may have two outputs: a digital output and a residue output.

Each stage of the pipelined ADC 400 may be configured to output one or more bits. As shown, the bit(s) output by a first stage (e.g., Stage 1) of the ADC 400 may represent the most significant bit(s) (MSB(s)) of the digital output, and the bit(s) output by the last stage (e.g., Stage k) of the ADC 400 may represent the least significant bit(s) (LSB(s)) of the digital output. The multi-stage ADC 400 may also include a digital combiner 408 for combining the output bit(s) from the stages to generate a complete digital output. As illustrated, the digital output may be the sum of the bit(s) output by each of the stages of the ADC 400 (e.g., after taking into consideration the relative significance of the bits).

In theory, an ADC (such as the ADC 400) may operate at a maximum sample rate known as the Nyquist rate, which is equal to half the sampling rate of the ADC. An over-sampling ratio (OSR) of the ADC may be defined as half the ratio of the sampling frequency ($f_s$) of the ADC to a maximum input bandwidth ($f_{in}$) of the ADC (e.g., OSR=$0.5f_s/f_{in}$). Many applications (e.g., wireless communications) operate with an OSR greater than 1. In this case, incorporating noise shaping into an ADC can further increase the ADC's dynamic range.

Noise shaping generally involves pushing quantization error and some portion of circuit noise to a higher frequency outside of the signal band. For example, if the input bandwidth is limited to [0 fs/8] (i.e., OSR=4) it may be desirable to reduce the noise in this band and move the noise to a frequency that is much higher than the input bandwidth (e.g., >>fs/8) in the output spectrum.

Accordingly, aspects of the present disclosure provide noise-shaping techniques for multi-stage ADCs (such as the ADC 400). Techniques disclosed herein may improve noise shaping in the last stage of the ADC and may be suitable for ADCs with an OSR larger than 2. An ADC topology which generates a higher-order noise transfer function (NTF) may allow for more complex noise shaping. However, some multi-stage ADC topologies only generate a first-order NTF. Accordingly, aspects of the present disclosure provide a multi-stage ADC topology with a second-order (or higher) NTF, as explained in more detail below.

Figure 5:
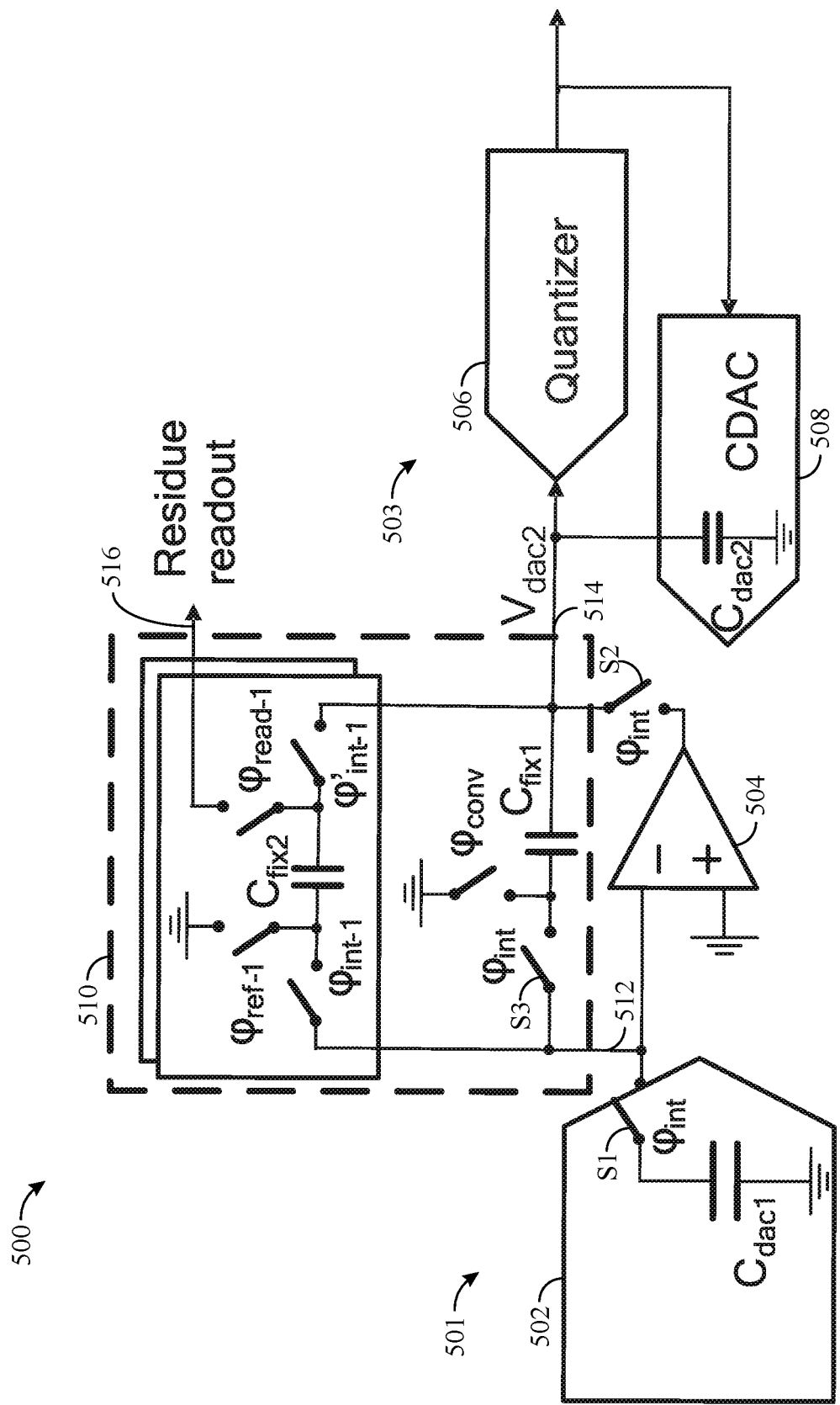
FIG. 5 is a schematic diagram of a portion of an example multi-stage ADC, illustrating an example switched-capacitor network, in accordance with certain aspects of the present disclosure.

FIG. 5 is a schematic diagram of a portion of an example multi-stage ADC 500 (e.g., a pipelined ADC), in accordance with aspects of the present disclosure. For ease of description and to avoid clutter in the drawings, switches may sometimes be referred to herein according to the control signal associated with the switch, and the name of the control signal may be indicative of the control signal phase. Similarly, capacitive elements may sometimes be referred to herein according to the capacitance of the capacitive element.

The ADC 500 may have a first conversion stage 501 (also referred to as the "first stage") including a first capacitor digital-to-analog converter (CDAC) 502, which may implement the DAC 404 in FIG. 4. The first CDAC 502 may have an output selectively coupled, via a first switch S1, to a first input of an inter-stage amplifier 504 (e.g., an operational transconductance amplifier (OTA)) and to a first port 512 of a switched-capacitor network 510. Although not illustrated, the first stage 501 may also include a quantizer (e.g., ADC 402), and the ADC 500 may have other previous stages before the first stage (e.g., the first stage may not be the initial stage of the ADC 500).

The first stage 501 of the ADC 500 may quantize an input voltage and generate a residue voltage by calculating an error between the input voltage and a voltage represented by the quantized value. The residue voltage generated by a given stage (e.g., stage n) may be equal to the input voltage minus a product of a digital output of the stage and a least significant bit (LSB) of the stage (e.g., $V_{res,n}=V_{in,n}-D_n*LSB_n$). The residue voltage of the first stage 501 may be stored in capacitors of the first CDAC 502 (e.g., represented by the capacitor $C_{dac1}$) as a residue output of the first stage.

A second conversion stage 503 (also referred to as the "second stage") of the ADC 500 may include a quantizer 506 and a second CDAC 508. An input of the second stage 503 may be coupled to a second port 514 of the switched-capacitor network 510 and selectively coupled, via a second switch S2, to an output of the amplifier 504. The second stage 503 may quantize the residue voltage output by the first CDAC 502 and amplified by the amplifier 504. The second stage 503 may be the last stage of the ADC 500. The second stage 503 of the ADC 500 may compare the residue voltage to a reference voltage and generate additional output bits, as explained in more detail below. The additional output bits may then be combined with the digital output(s) of the previous stage(s) to generate the final output of the ADC 500 (as explained above with respect to FIG. 4).

The quantizer 506 may quantize the amplified version of the residue voltage and output a digital signal representative of the residue voltage. In some aspects, the quantizer 506 may be a successive approximation register (SAR) quantizer, in which case the second CDAC 508 is controlled by a digital code from SAR logic in the quantizer 506. The second CDAC 508 may convert the digital output signal of the quantizer 506 into an analog voltage, subtract the generated voltage from the residue voltage of the previous stage, and output the voltage difference (e.g., a residue voltage of the last stage of the ADC 500). The second CDAC 508 may have a total internal capacitance, represented by a capacitor $C_{dac2}$.

As illustrated, the switched-capacitor network 510 generally includes a first capacitive element $C_{fix1}$ and a second capacitive element $C_{fix2}$, which may be replicated and used for reference scaling. The first capacitive element $C_{fix1}$ may have a first terminal coupled to the second port 514 of the switched-capacitor network 510 and a second terminal selectively coupled, via a third switch S3, to the first port 512 of the switched-capacitor network 510. The second terminal of the first capacitive element $C_{fix1}$ may also be selectively coupled, via a fourth switch $\varphi_{conv}$, to a reference potential node (e.g., electrical ground) of the ADC 500. The second capacitive element $C_{fix2}$ may have a first terminal selectively coupled, via a fifth switch $\varphi_{int-1}$, to the first port 512 and selectively coupled, via a sixth switch $\varphi_{ref-1}$, to the reference potential node of the ADC. The second capacitive element $C_{fix2}$ may also have a second terminal selectively coupled, via a seventh switch $\varphi'_{int-1}$, to the second port 514. The second terminal of the second capacitive element $C_{fix2}$ may be selectively coupled, via an eighth switch $\varphi_{read-1}$, to a third port 516 (e.g., a residue readout port) of the switched-capacitor network 510.

During conversion, the fourth switch $\varphi_{conv}$ is configured to be closed, and the first switch S1, the second switch S2, and the third switch S3 are configured to be open, such that the first capacitive element $C_{fix1}$ coupled in parallel with the capacitor $C_{dac2}$. During conversion, the fifth switch $\varphi_{int-1}$ and the eighth switch $\varphi_{read-1}$ may be configured to be open, and the sixth switch $\varphi_{ref-1}$ and the seventh switch $\varphi'_{int-1}$ may be configured to be closed, such that the second capacitive element $C_{fix2}$ is coupled in parallel with the first capacitive element $C_{fix1}$ and the capacitor $C_{dac2}$. The amplifier 504 is not operational during conversion, and may therefore be turned off to save power.

During amplification, the first switch S1, the second switch S2, and the third switch S3 may be configured to be closed, and the fourth switch $\varphi_{conv}$ may be configured to be open, such that the first capacitive element $C_{fix1}$ is coupled in feedback with the amplifier 504. During amplification, the fifth switch $\varphi_{int-1}$ and the seventh switch $\varphi'_{int-1}$ may be configured to be closed, and the sixth switch $\varphi_{ref-1}$ and the eighth switch $\varphi_{read-1}$ may be configured to be open such that the second capacitive element $C_{fix2}$ is coupled in parallel with the first capacitive element $C_{fix1}$ in feedback with the amplifier 504.

The amplifier 504 may be configured to amplify the residue voltage from the first stage of the ADC 500 (e.g., the residue voltage output by the first CDAC 502). The gain of the amplifier 504 may be equal to the capacitance $C_{dac1}$ divided by a total capacitance of the switched-capacitor network 510 (e.g., $C_{fix1}+C_{fix2}$).

According to aspects of the present disclosure, the switched-capacitor network 510 may configured to provide a second-order or higher NTF for noise shaping of quantization noise of the second conversion stage 503. To introduce a second-order term to the NTF, the ADC 500 is configured to store a residue voltage from two sample cycles before the current cycle, in addition to a residue voltage from one sample cycle before the current cycle. Accordingly, in some aspects, the second capacitive element $C_{fix2}$ may be implemented by two capacitors of the same size, $C_{fix2A}$ and $C_{fix2B}$, as illustrated in FIGS. 6A-6D. In this case, the capacitor $C_{fix2A}$ may be referred to as a second capacitive element and the capacitor $C_{fix2B}$ may be referred to as a third capacitive element of the switched-capacitor network 510. The capacitor $C_{fix2A}$ may store a residue voltage sample from two sample cycles before the current cycle, and the capacitor $C_{fix2B}$ may store a residue voltage sample from one sample cycle before the current cycle, or vice versa. Accordingly, the two capacitors implementing the capacitor $C_{fix2}$ generate a second-order term in the NTF of the ADC 500, which allows for a higher degree of freedom and more programmability/control of the noise shaping. One or more additional capacitors replicating the second capacitive element $C_{fix2}$ (and associated switches) may be added in the switched-capacitor network 510 to store residue voltage samples further back than two previous sample cycles and to thereby implement higher order NTFs.

At a given time (e.g., during either amplification or conversion), only one of capacitors $C_{fix2A}$ and $C_{fix2B}$ may be used in parallel with the first capacitive element $C_{fix1}$. In some aspects, the other one of capacitor $C_{fix2A}$ or $C_{fix2B}$ may be read (e.g., a switch $\varphi_{read-1}$ or a switch $\varphi_{read-2}$ may be closed). Readout of the residue on capacitor $C_{fix2A}$ or $C_{fix2B}$ may enable more processing (e.g., extra noise shaping using feedforward topology and/or sending the residue to another sub-ADC in a time-interleaved (TI) ADC).

Figure 6A:
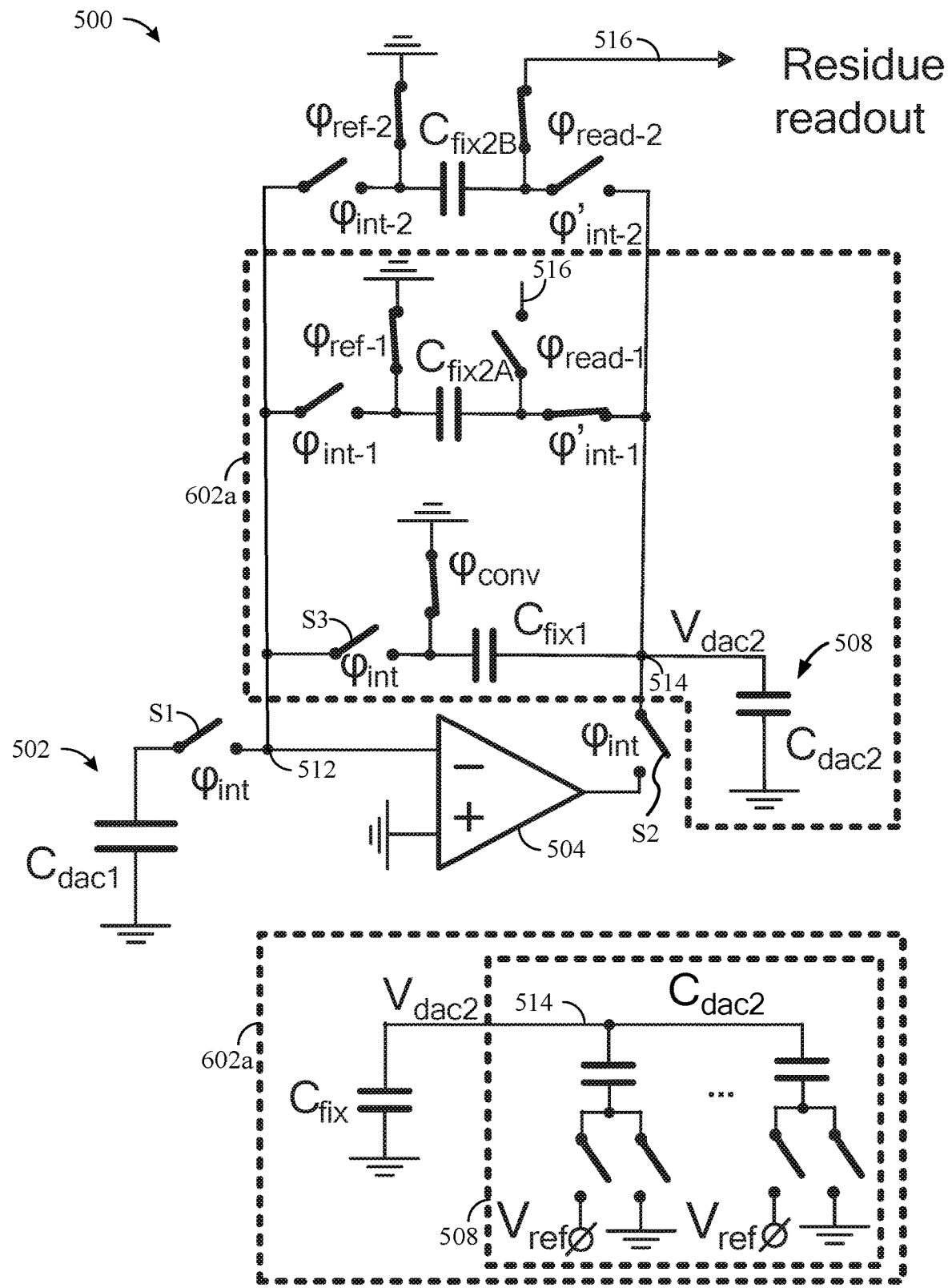
FIG. 6A illustrates an example switch configuration in the switched-capacitor network of FIG. 5 during a first conversion cycle, in accordance with certain aspects of the present disclosure.

FIG. 6A illustrates an example switch configuration of the switched-capacitor network 510 during a first conversion cycle of the ADC 500. As shown, capacitor $C_{fix2A}$ may have a first terminal selectively coupled, via the fifth switch $\varphi_{int-1}$, to the first port 512 and selectively coupled, via the sixth switch $\varphi_{ref-1}$, to the reference potential node of the ADC. The capacitor $C_{fix2A}$ may also have a second terminal selectively coupled, via the seventh switch $\varphi'_{int-1}$, to the second port 514. In certain aspects, the second terminal of the capacitor $C_{fix2A}$ is selectively coupled, via the eighth switch $\varphi_{read-1}$, to the optional third port 516 of the switched-capacitor network 510 for residue readout.

The capacitor $C_{fix2B}$ may have a first terminal selectively coupled, via a ninth switch $\varphi_{int-2}$, to the first port 512 and selectively coupled, via a tenth switch $\varphi_{ref-2}$, to the reference potential node of the ADC 500. The capacitor $C_{fix2B}$ may also have a second terminal selectively coupled, via an eleventh switch $\varphi'_{int-2}$, to the second port 514. In certain aspects, the second terminal of the capacitor $C_{fix2B}$ is selectively coupled, via a twelfth switch $\varphi_{read-2}$, to the third port 516 of the switched-capacitor network 510.

As illustrated, during the first conversion cycle, the switch $\varphi_{conv}$ is closed, thereby coupling the capacitor $C_{fix1}$ between the second port 514 and the reference potential node. Additionally, switches $\varphi_{ref-1}$ and $\varphi'_{int-1}$ are closed, thereby coupling the capacitor $C_{fix2A}$ in parallel with the capacitor $C_{fix1}$. When coupled in parallel, the capacitors $C_{fix1}$ and $C_{fix2A}$ may be collectively referred to as a capacitor $C_{fix}$, also representing the effective capacitance of the switched-capacitor network 510 at any moment in time. The capacitance of the capacitor $C_{fix}$ scales the effective reference voltage of the second stage of the ADC 500. According to certain aspects, the capacitance $C_{fix}$ may be equal to $C_{fix1}+C_{fix2A}$ during certain cycles (e.g., even conversion cycles).

At the end of the first conversion cycle, the capacitor $C_{dac2}$ holds a voltage $V_{dac2}$, which is equal to a residue voltage (e.g., $V_{res}$) corresponding to the quantization error generated during the first conversion cycle. As illustrated by dashed boxes 602a, the capacitors $C_{fix1}$ and $C_{fix2A}$ are also coupled in parallel with the capacitor $C_{dac2}$ in the equivalent circuit at the bottom of FIG. 6A. Accordingly, the capacitors $C_{fix1}$ and $C_{fix2A}$ hold the same voltage as the capacitor $C_{dac2}$ (e.g., the residue voltage generated during the first conversion cycle). During the first conversion cycle, the capacitor $C_{fix2B}$ may optionally be read out by other circuitry by closing the switches $\varphi_{ref-2}$ and $\varphi_{read-2}$, as shown.

In some aspects, the control signal $\varphi_{ref-n}$ may be obtained by performing an operation for $\varphi_{read-n}$ and $\varphi_{conv}$. Charging of capacitors $C_{fix2A}$ and $C_{fix2B}$, as well as their respective clock signals, may be interleaved. For example, control signal $\varphi_{int-1}$ may have twice the period of $\varphi_{int}$, and $\varphi_{int-2}$ may be a delayed version of $\varphi_{int-1}$ by one period of $\varphi_{int}$.

As illustrated, the second CDAC 508 may be implemented by a plurality of capacitors selectively coupled between the second port 514 and either electrical ground or a reference voltage (e.g., $V_{ref}$). When a capacitor is switched between electrical ground and the reference voltage, there is a voltage jump that is proportional to the ratio of the capacitance of the capacitor being switched to the total capacitance of the circuit (e.g., $C_{dac2}+C_{fix}$). For the smallest capacitor in the second CDAC 508 (e.g., the least significant bit (LSB) for the second CDAC 508), the voltage jump may define the full scale reference of the second CDAC 508. The full scale of the quantizer 506 may be different than the full scale of the second CDAC 508. Reference scaling (e.g., reference reduction) may be used to reduce the voltage jump. By including effective capacitance $C_{fix}$, the total capacitance of the ADC 500 becomes larger, thereby reducing the voltage jump and the full scale of the last stage.

Additionally, aspects of the present disclosure may increase the speed of the ADC. In some ADC topologies, at any given time, a capacitor $C_{fix}$ (in addition to the capacitor $C_{dac2}$) loads the inter-stage amplifier (e.g., the amplifier 504). The capacitor $C_{fix}$ may have a capacitance considerably larger than the capacitance $C_{dac2}$, and the large load capacitance can slow down operation of the amplifier. Accordingly, aspects of the present disclosure provide a smaller load to the inter-stage amplifier during amplification. For example, during amplification, the $C_{fix}$ capacitors are not coupled between the output of the amplifier 504 and the reference potential (e.g., electrical ground). Accordingly, the amplifier 504 has a reduced load and may operate faster (e.g., the settling time of the amplifier 504 may be reduced by up to 40% or potentially more) and with higher power efficiency.

Some ADC topologies include duplicate $C_{fix}$ capacitors, which contribute to the lateral area (e.g., footprint) consumed by the ADC. Aspects of the current disclosure, therefore, provide a switched-capacitor topology with only one $C_{fix1}$, thereby reducing the footprint of the ADC. Moreover, a closed-loop amplification topology (e.g., as illustrated in FIG. 5) achieves an increased inter-stage gain accuracy (gain=$C_{dac1}/\Sigma C_{fixn}$) compared to an open-loop amplification topology. No dedicated residue processing is needed, and no additional time is needed for noise shaping, except feeding back the LSB to $C_{dac2}$.

Figure 6B:
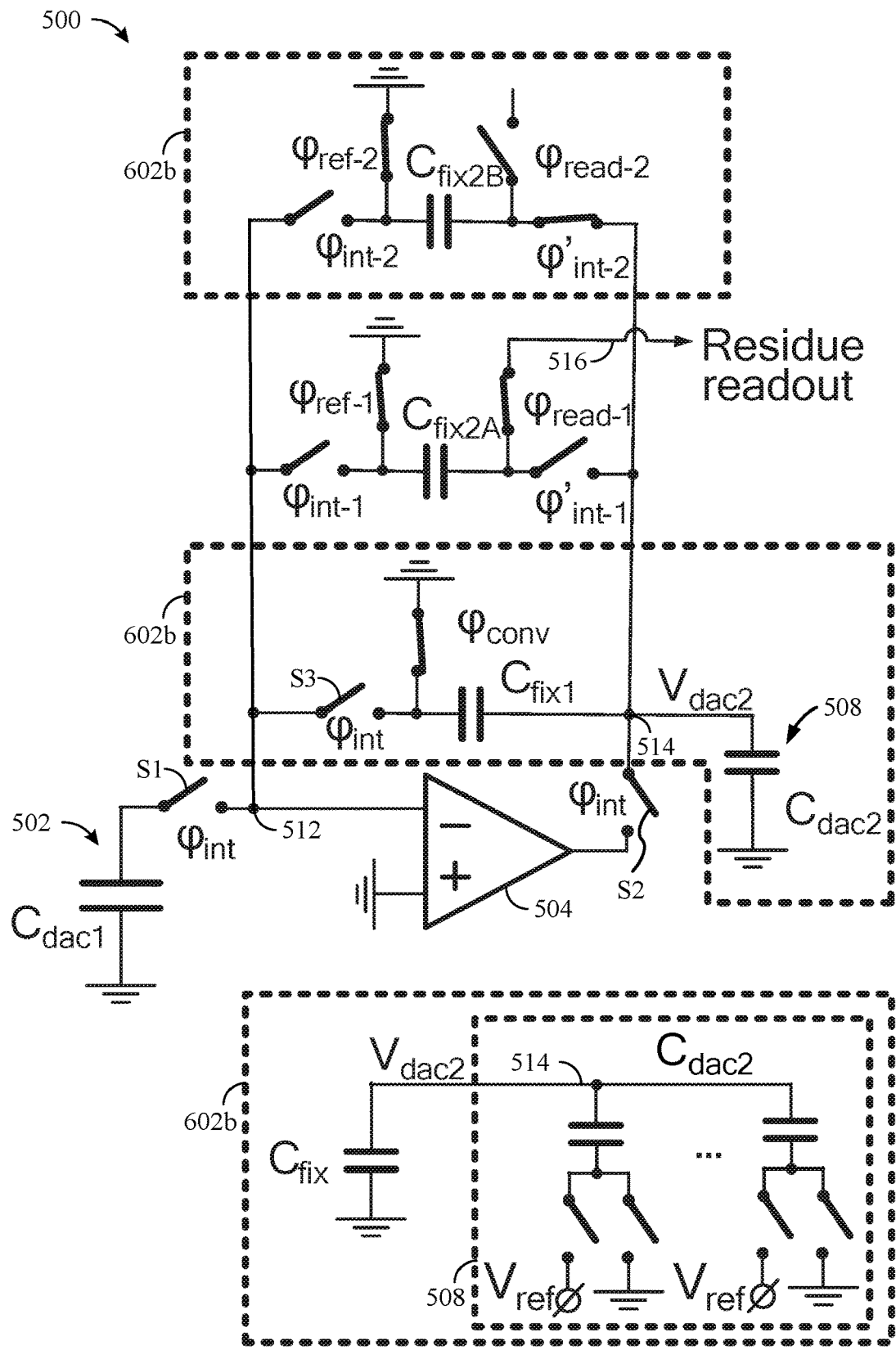
FIG. 6B illustrates an example switch configuration in the switched-capacitor network of FIG. 5 during a second conversion cycle, in accordance with certain aspects of the present disclosure.

FIG. 6B illustrates an example switch configuration of the switched-capacitor network 510 during a second conversion cycle of the ADC 500. As illustrated, during the second conversion cycle, the switch $\varphi_{conv}$ is closed, thereby coupling the capacitor $C_{fix1}$ between the second port 514 and the reference potential node. Additionally, the switches $\varphi_{ref-2}$ and $\varphi'_{int-2}$ are closed, thereby coupling the capacitor $C_{fix2B}$ in parallel with the capacitor $C_{fix1}$. When coupled in parallel, the capacitors $C_{fix1}$ and $C_{fix2B}$ may be collectively referred to as the capacitor $C_{fix}$. According to certain aspects, $C_{fix}$ may be equal to $C_{fix1}+C_{fix2B}$ during odd cycles.

At the end of the second conversion cycle, the capacitor $C_{dac2}$ holds a voltage $V_{dac2}$, which is equal to a residue voltage (e.g., $V_{res}$) corresponding to the quantization error generated during the second conversion cycle. As illustrated by dashed boxes 602b, the capacitors $C_{fix1}$ and $C_{fix2B}$ are also coupled in parallel with the capacitor $C_{dac2}$ in the equivalent circuit at the bottom of FIG. 6B. Accordingly, the capacitors $C_{fix1}$ and $C_{fix2B}$ hold the same voltage as the capacitor $C_{dac2}$ (e.g., the residue voltage generated during the second conversion cycle). During the second conversion cycle, the capacitor $C_{fix2A}$ may optionally be read out by other circuitry by closing the switches $\varphi_{ref-1}$ and $\varphi_{read-1}$, as shown.

Figure 6C:
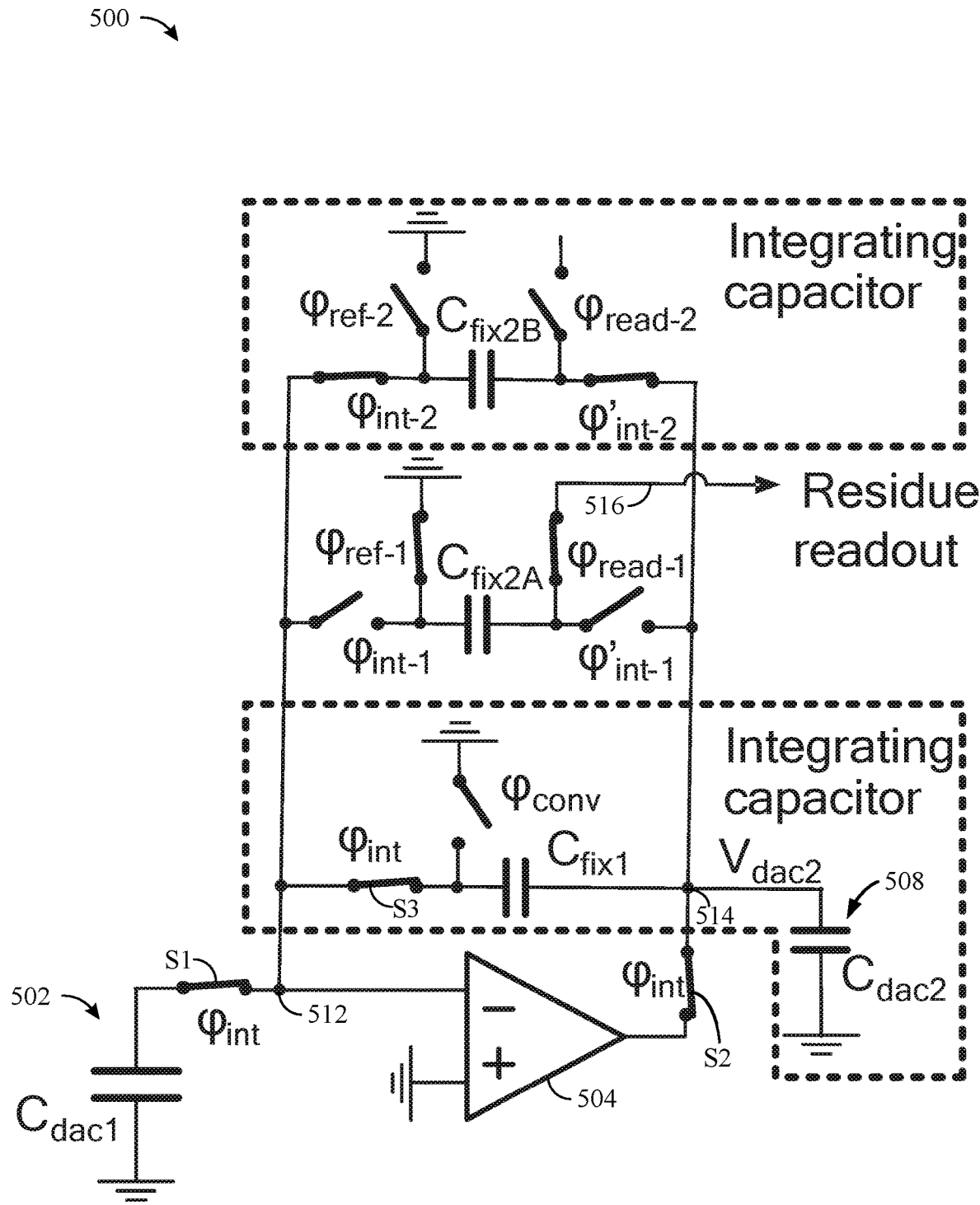
FIG. 6C illustrates an example switch configuration in the switched-capacitor network of FIG. 5 during a first amplification cycle, in accordance with certain aspects of the present disclosure.

FIG. 6C illustrates an example switch configuration of the switched-capacitor network 510 during a first amplification cycle (sometimes referred to as an "integration cycle") of the ADC 500. As illustrated, during the first amplification cycle, the switches S1, S2, and S3 (which are each controlled by a control signal $\varphi_{int}$) will be closed, thereby coupling the output of the first CDAC 502 to the first input of the amplifier 504, and coupling the capacitor $C_{fix1}$ in a feedback loop with the amplifier 504. Additionally, during the first amplification cycle, switches $\varphi_{int-2}$ and $\varphi'_{int-2}$ will also be closed such that capacitor $C_{fix2B}$ is coupled in parallel with capacitor $C_{fix1}$ (e.g., in the feedback loop with the amplifier 504).

During amplification cycles, the amplifier 504 is active and operates in a closed-loop configuration, having a gain of $C_{dac1}/C_{fix}$. The capacitor $C_{fix1}$ carries the residue sample from the previous conversion cycle (e.g., $V_{res}[n-1]$), and the capacitor $C_{fix2B}$ carries the residue sample from two conversion cycles previous (e.g., $V_{res}[n-2]$). During the first amplification cycle, the voltages stored on the capacitors $C_{fix1}$ and $C_{fix2B}$ are fed back to the input of the amplifier 504. As a result, a new voltage (e.g., $V_{dac2}[n]$) is generated at the second port 514. The new voltage may be expressed by the equation:

$$V_{dac2}[n] = -V_{dac1} + C_{fix1}V_{res}[n-1]/C_{fix} + C_{fix2}V_{res}[n-2]/C_{fix}$$

where $C_{fix2}$ is equal to the capacitance of the capacitor $C_{fix2B}$ during the first amplification cycle (e.g., during odd amplification cycles), and equal to the capacitance of the capacitor $C_{fix2A}$ during a second amplification cycle (e.g., during even amplification cycles), described in more detail below with respect to FIG. 6D.

This equation may be represented in the z-domain by a second-order noise transfer function (NTF) equal to $1-a_1z^{-1}-a_2z^{-2}$, where $a_n=C_{fixn}/C_{fix}$ and $|a_1|+|a_2|+\ldots=1$. The second-order NTF is a high-pass function that may filter out noise at low frequencies, but allow noise to pass at higher frequencies, thereby enabling programmable noise shaping.

As described above, higher-order noise transfer functions (e.g., third order, fourth order, etc.) may be generated by using additional capacitors $C_{fix2}$ coupled in a similar manner as the capacitors $C_{fix2A}$ and $C_{fix2B}$. For example, to generate a third-order NTF, an additional capacitor $C_{fix2C}$ (being the same size as the capacitors $C_{fix2A}$ and $C_{fix2B}$) may be selectively coupled between different nodes using switches, in a similar manner as was described with respect to the capacitors $C_{fix2A}$ and $C_{fix2B}$. In this case, residue voltage samples from one, two, and three conversion cycles previous may be stored and used to generate a new residue voltage during a given cycle.

During the first amplification cycle, the capacitor $C_{fix2A}$ may optionally be read out by other circuitry by closing the switches $\varphi_{ref-1}$ and $\varphi_{read-1}$, as shown.

Figure 6D:
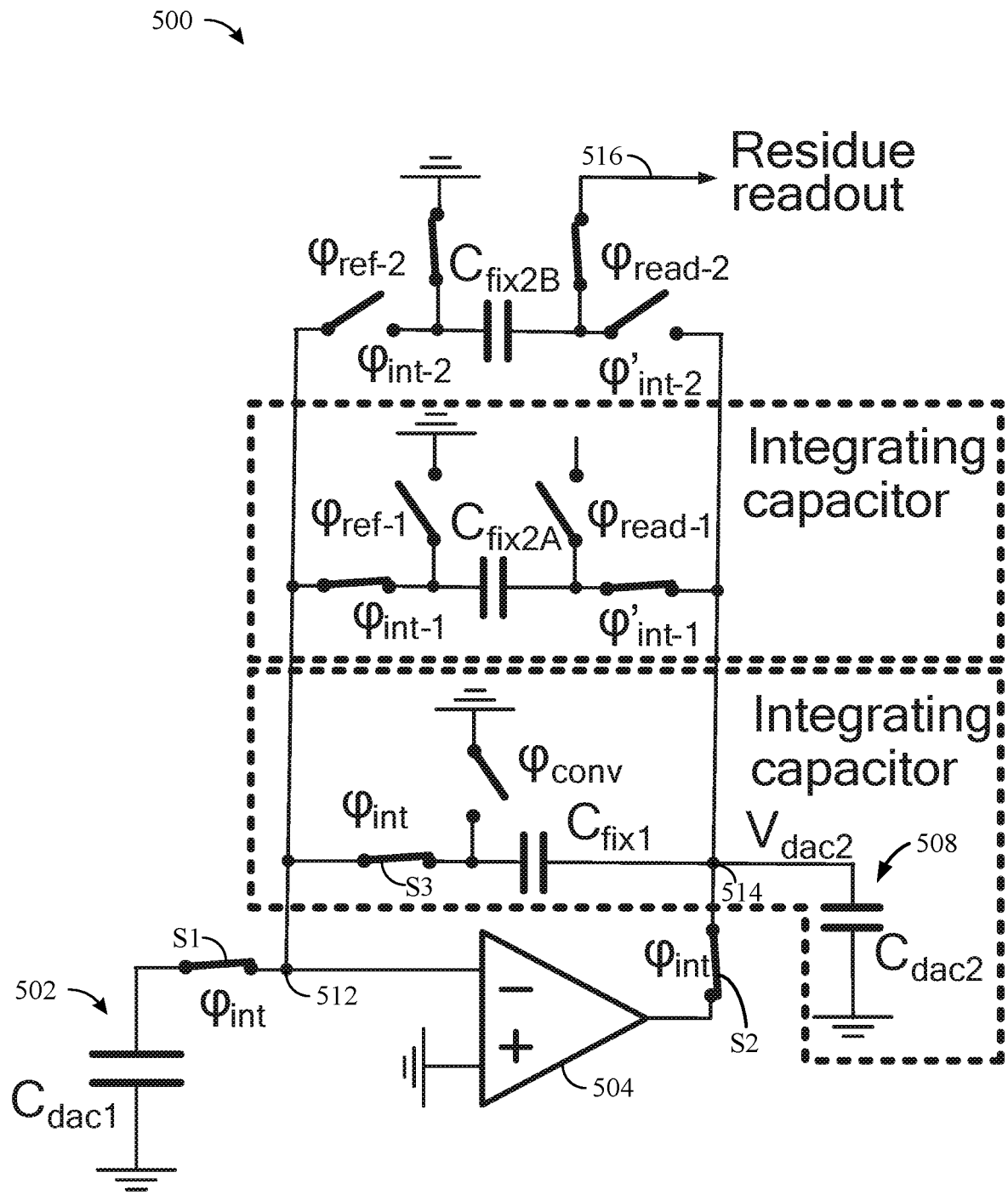
FIG. 6D illustrates an example switch configuration in the switched-capacitor network of FIG. 5 during a second amplification cycle, in accordance with certain aspects of the present disclosure.

FIG. 6D illustrates an example switch configuration of the switched-capacitor network 510 during a second amplification cycle of the ADC 500. As was the case during the first amplification cycle, during the second amplification cycle, the switches S1, S2, and S3 will be closed, thereby coupling the first CDAC 502 to the first input of the amplifier 504, and coupling the capacitor $C_{fix1}$ in a feedback loop with the amplifier 504. Additionally, during the second amplification cycle, switches $\varphi_{int-1}$ and $\varphi'_{int-1}$ will also be closed such that capacitor $C_{fix2A}$ is coupled in parallel with capacitor $C_{fix1}$ (e.g., in the feedback loop with the amplifier 504). As a result, the voltages stored on capacitors $C_{fix1}$ and $C_{fix2A}$ are fed back to the input of the amplifier 504.

During the second amplification cycle, the amplifier 504 is active and operates in a closed-loop configuration. The capacitor $C_{fix1}$ carries the residue sample from the previous conversion cycle (e.g., $V_{res}[n-1]$), and the capacitor $C_{fix2A}$ carries the residue sample from two conversion cycles previous (e.g., $V_{res}[n-2]$). During the second amplification cycle, the voltages stored on the capacitors $C_{fix1}$ and $C_{fix2A}$ are fed back to the input of the amplifier 504. As a result, a new voltage (e.g., $V_{dac2}[n]$) is generated at the second port 514, as described above.

During the second amplification cycle, the capacitor $C_{fix2B}$ may optionally be read out by other circuitry by closing the switches $\varphi_{ref-2}$ and $\varphi_{read-2}$, as shown.

Example Conversion Operations

FIG. 7 is a flow diagram of example operations 700 for analog-to-digital conversion using an analog-to-digital converter (ADC) (e.g., the ADC 500), in accordance with certain aspects of the present disclosure. The ADC generally includes a first conversion stage (e.g., the first stage 501), a second conversion stage (e.g., the second stage 503), an amplifier (e.g., the amplifier 504) selectively coupled between the first conversion stage and the second conversion stage, and a switched-capacitor network (e.g., the switched-capacitor network 510) coupled between an input of the amplifier and an input of the second conversion stage.

The operations 700 may generally involve, at block 702, coupling (e.g., via the switch $\varphi_{conv}$), during a conversion phase of the ADC, a first capacitive element (e.g., the first capacitive element $C_{fix1}$) of the switched-capacitor network in parallel with a capacitive element associated with the second conversion stage (e.g., the capacitor $C_{DAC2}$). The operations 700 may also involve, at block 704, coupling (e.g., via the switches S2 and S3), during an amplification phase of the ADC, the first capacitive element between the input of the amplifier and an output of the amplifier.

In certain aspects, the operations 700 may further involve, during the conversion phase, decoupling the input of the amplifier from a residue output of the first conversion stage (e.g., the output of the first CDAC 502). In this case, coupling the first capacitive element in parallel with the capacitive element associated with the second conversion stage may include coupling a terminal of the first capacitive element to a reference potential node (e.g., electrical ground) of the ADC. For certain aspects, the operations 700 may also include, during the conversion phase, decoupling the output of the amplifier from the switched-capacitor network and from the input of the second conversion stage.

According to certain aspects, the operations 700 may further involve, during the amplification phase, coupling the input of the amplifier to the residue output of the first conversion stage. In this case, coupling the first capacitive element between the input of the amplifier and an output of the amplifier may include coupling the output of the amplifier to the switched-capacitor network and to the input of the second conversion stage. For certain aspects, the operations 700 may also involve, during the amplification phase, decoupling the terminal of the first capacitive element from the reference potential node of the ADC.

According to certain aspects, the operations 700 may further involve coupling, during every $n^{th}$ cycle of the conversion phase (e.g., every odd cycle, where n=2), where n is a positive integer, a second capacitive element (e.g., capacitor $C_{fix2A}$) of the switched-capacitor network in parallel with the first capacitive element and the capacitive element associated with the second conversion stage; and coupling, during every $n^{th}$ cycle of the amplification phase, the second capacitive element between the input of the amplifier and the output of the amplifier, such that the second capacitive element is in parallel with the first capacitive element.

In certain aspects, the operations 700 may further involve coupling, during a cycle after every $n^{th}$ cycle of the conversion phase (e.g., every even cycle, where n=2), a third capacitive element (e.g., capacitor $C_{fix2B}$) of the switched-capacitor network in parallel with the first capacitive element and the capacitive element associated with the second conversion stage, wherein the second capacitive element is decoupled from the input of the second conversion stage during the cycle; and coupling, during a cycle after every $n^{th}$ cycle of the amplification phase, the third capacitive element between the input of the amplifier and the output of the amplifier, such that the third capacitive element is in parallel with the first capacitive element, wherein the second capacitive element is decoupled from the input and the output of the amplifier during the cycle.

According to certain aspects, the operations 700 may further involve at least one of: reading out a residue voltage from the second capacitive element during the cycle after every $n^{th}$ cycle of the conversion phase; or reading out a residue voltage from the third capacitive element during every $n^{th}$ cycle of the conversion phase.

Example Aspects

In addition to the various aspects described above, specific combinations of aspects are within the scope of the present disclosure, some of which are detailed below:

Aspect 1: An analog-to-digital converter (ADC) comprising: a first conversion stage having a residue output; an amplifier having an input selectively coupled to the residue output of the first conversion stage; a second conversion stage having an input selectively coupled to an output of the amplifier; and a switched-capacitor network having a first port coupled to the input of the amplifier and having a second port coupled to the input of the second conversion stage, the switched-capacitor network being configured to provide a second-order or higher noise transfer function for noise shaping of quantization noise of the second conversion stage.

Aspect 2: The ADC of Aspect 1, wherein the switched-capacitor network comprises a first capacitive element having a first terminal coupled to the second port and having a second terminal selectively coupled to a reference potential node of the ADC and selectively coupled to the first port.

Aspect 3: The ADC of Aspect 2, wherein the ADC is configured to: couple the first capacitive element in parallel with a capacitive element associated with the second conversion stage during a conversion phase; and couple the first capacitive element between the input of the amplifier and the output of the amplifier during an amplification phase.

Aspect 4: The ADC of Aspect 2 or 3, further comprising: a first switch coupled between the residue output of the first conversion stage and the input of the amplifier; a second switch coupled between the output of the amplifier and the second port of the switched-capacitor network; a third switch coupled between the first port of the switched-capacitor network and the second terminal of the first capacitive element; and a fourth switch coupled between the second terminal of the first capacitive element and the reference potential node.

Aspect 5: The ADC of Aspect 4, wherein: during an amplification phase, the first switch, the second switch, and the third switch are configured to be closed and the fourth switch is configured to be open; and during a conversion phase, the fourth switch is configured to be closed and the first switch, the second switch, and the third switch are configured to be open.

Aspect 6: The ADC of any of Aspects 2-5, wherein the switched-capacitor network further comprises a second capacitive element having a first terminal selectively coupled to the first port and selectively coupled to the reference potential node of the ADC and having a second terminal selectively coupled to the second port.

Aspect 7: The ADC of Aspect 6, wherein the second terminal of the second capacitive element is selectively coupled to a third port of the switched-capacitor network.

Aspect 8: The ADC of Aspect 6 or 7, further comprising: a first switch coupled between the first port of the switched-capacitor network and the first terminal of the second capacitive element; a second switch coupled between the first terminal of the second capacitive element and the reference potential node of the ADC; and a third switch coupled between the second terminal of the second capacitive element and the second port of the switched-capacitor network.

Aspect 9: The ADC of any of Aspects 6-8, wherein the switched-capacitor network further comprises a third capacitive element having a first terminal selectively coupled to the first port and selectively coupled to the reference potential node of the ADC and having a second terminal selectively coupled to the second port.

Aspect 10: The ADC of Aspect 9, wherein the second terminal of the third capacitive element is selectively coupled to a third port of the switched-capacitor network.

Aspect 11: The ADC of Aspect 9 or 10, further comprising: a first switch coupled between the first port of the switched-capacitor network and the first terminal of the second capacitive element; a second switch coupled between the first terminal of the second capacitive element and the reference potential node of the ADC; a third switch coupled between the second terminal of the second capacitive element and the second port of the switched-capacitor network; a fourth switch coupled between the first port of the switched-capacitor network and the first terminal of the third capacitive element; a fifth switch coupled between the first terminal of the third capacitive element and the reference potential node of the ADC; and a sixth switch coupled between the second terminal of the third capacitive element and the second port of the switched-capacitor network.

Aspect 12: The ADC of Aspect 11, wherein: during a first conversion phase, the second switch, the third switch, and the fifth switch are configured to be closed and the first switch, the fourth switch, and the sixth switch are configured to be open; and during a second conversion phase, the second switch, the fifth switch, and the sixth switch are configured to be closed and the first switch, the third switch, and the fourth switch are configured to be open.

Aspect 13: The ADC of any of the preceding Aspects, wherein the second conversion stage is a last stage of the ADC.

Aspect 14: The ADC of any of the preceding Aspects, wherein the ADC comprises a pipelined ADC.

Aspect 15: An analog-to-digital converter (ADC) comprising: a first conversion stage having a residue output; an amplifier having an input selectively coupled to the residue output of the first conversion stage; a second conversion stage having an input selectively coupled to an output of the amplifier; and a switched-capacitor network having a first port coupled to the input of the amplifier and having a second port coupled to the input of the second conversion stage, the switched-capacitor network having a first capacitive element having a first terminal coupled to the second port and having a second terminal selectively coupled to a reference potential node of the ADC and selectively coupled to the first port.

Aspect 16: The ADC of Aspect 15, wherein the ADC is configured to: couple the first capacitive element in parallel with a capacitive element associated with the second conversion stage during a conversion phase; and couple the first capacitive element between the input of the amplifier and the output of the amplifier during an amplification phase.

Aspect 17: The ADC of Aspect 15 or 16, further comprising: a first switch coupled between the residue output of the first conversion stage and the input of the amplifier; a second switch coupled between the output of the amplifier and the second port of the switched-capacitor network; a third switch coupled between the first port of the switched-capacitor network and the second terminal of the first capacitive element; and a fourth switch coupled between the second terminal of the first capacitive element and the reference potential node.

Aspect 18: The ADC of Aspect 17, wherein: during an amplification phase, the first switch, the second switch, and the third switch are configured to be closed and the fourth switch is configured to be open; and during a conversion phase, the fourth switch is configured to be closed and the first switch, the second switch, and the third switch are configured to be open.

Aspect 19: The ADC of any of Aspects 15-18, wherein the switched-capacitor network further comprises a second capacitive element having a first terminal selectively coupled to the first port of the switched-capacitor network and selectively coupled to the reference potential node of the ADC and having a second terminal selectively coupled to the second port of the switched-capacitor network.

Aspect 20: The ADC of Aspect 19, wherein the switched-capacitor network further comprises a third capacitive element having a first terminal selectively coupled to the first port of the switched-capacitor network and selectively coupled to the reference potential node of the ADC and having a second terminal selectively coupled to the second port of the switched-capacitor network.

Aspect 21: The ADC of any of Aspects 15-20, wherein the second conversion stage is a last stage of the ADC.

Aspect 22: The ADC of any of Aspects 15-21, wherein the ADC comprises a pipelined ADC.

Aspect 23: A method of analog-to-digital conversion using an analog-to-digital converter (ADC) comprising a first conversion stage, a second conversion stage, an amplifier selectively coupled between the first conversion stage and the second conversion stage, and a switched-capacitor network coupled between an input of the amplifier and an input of the second conversion stage, the method comprising: coupling, during a conversion phase of the ADC, a first capacitive element of the switched-capacitor network in parallel with a capacitive element associated with the second conversion stage; and coupling, during an amplification phase of the ADC, the first capacitive element between the input of the amplifier and an output of the amplifier.

Aspect 24: The method of Aspect 23, further comprising, during the conversion phase: decoupling the input of the amplifier from a residue output of the first conversion stage, wherein coupling the first capacitive element in parallel with the capacitive element associated with the second conversion stage comprises coupling a terminal of the first capacitive element to a reference potential node of the ADC; and decoupling the output of the amplifier from the switched-capacitor network and from the input of the second conversion stage.

Aspect 25: The method of Aspect 24, further comprising, during the amplification phase: coupling the input of the amplifier to the residue output of the first conversion stage, wherein coupling the first capacitive element between the input of the amplifier and an output of the amplifier comprises coupling the output of the amplifier to the switched-capacitor network and to the input of the second conversion stage; and decoupling the terminal of the first capacitive element from the reference potential node of the ADC.

Aspect 26: The method of any of Aspects 23-25, further comprising: coupling, during every $n^{th}$ cycle of the conversion phase, where n is a positive integer, a second capacitive element of the switched-capacitor network in parallel with the first capacitive element and the capacitive element associated with the second conversion stage; and coupling, during every $n^{th}$ cycle of the amplification phase, the second capacitive element between the input of the amplifier and the output of the amplifier, such that the second capacitive element is in parallel with the first capacitive element.

Aspect 27: The method of Aspect 26, further comprising: coupling, during a cycle after every $n^{th}$ cycle of the conversion phase, a third capacitive element of the switched-capacitor network in parallel with the first capacitive element and the capacitive element associated with the second conversion stage, wherein the second capacitive element is decoupled from the input of the second conversion stage during the cycle; and coupling, during a cycle after every $n^{th}$ cycle of the amplification phase, the third capacitive element between the input of the amplifier and the output of the amplifier, such that the third capacitive element is in parallel with the first capacitive element, wherein the second capacitive element is decoupled from the input and the output of the amplifier during the cycle.

Aspect 28: The method of Aspect 27, further comprising at least one of: reading out a residue voltage from the second capacitive element during the cycle after every $n^{th}$ cycle of the conversion phase; or reading out a residue voltage from the third capacitive element during every $n^{th}$ cycle of the conversion phase.

Aspect 29: An analog-to-digital converter (ADC) comprising: first means for converting an analog input signal to a first digital output signal; means for amplifying a residue from the first means for converting; second means for converting the amplified residue to a second digital output signal; and means for providing a second-order or higher noise transfer function for noise shaping of quantization noise of the second means for converting.

Conclusion

Described herein is an analog-to-digital converter (ADC) circuit design for noise shaping in multi-stage ADCs. Certain aspects of the present disclosure provide a switched-capacitor network coupled between a first conversion stage and a second conversion stage of the ADC. During a conversion phase of the ADC, a capacitive element in the switched-capacitor network is selectively coupled in parallel with a capacitive element associated with the second conversion stage. During an amplification phase of the ADC, the capacitive element in the switched-capacitor network is coupled in a feedback path for an inter-stage amplifier of the ADC. The switched-capacitor network may be configured to provide a second-order or higher noise transfer function for noise shaping of quantization noise of the second conversion stage.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components. For example, first means for converting an analog input signal to a first digital output signal may include a first conversion stage, such as the first conversion stage (including the first CDAC 502) of FIG. 5 or 6A-6D. Means for amplifying a residue may include an amplifier (e.g., an interstage amplifier), such as the amplifier 504 of FIG. 5 or 6A-6D. Second means for converting the amplified residue to a second digital output signal may include a second conversion stage, such as the second conversion stage (including the quantizer 506 and the second CDAC 508) of FIG. 5 or 6A-6D. Means for providing a second-order or higher noise transfer function for noise shaping of quantization noise of the second means for converting may include a switched capacitor network, such as the switched-capacitor network 510 of FIG. 5 or 6A-6D.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An analog-to-digital converter (ADC) comprising:
   a first conversion stage having a residue output;
   an amplifier having an input selectively coupled to the residue output of the first conversion stage;
   a second conversion stage having an input selectively coupled to an output of the amplifier; and
   a switched-capacitor network having a first port coupled to the input of the amplifier and having a second port coupled to the input of the second conversion stage, the switched-capacitor network being configured to provide a second-order or higher noise transfer function for noise shaping of quantization noise of the second conversion stage.

2. The ADC of claim 1, wherein the switched-capacitor network comprises a first capacitive element having a first terminal coupled to the second port and having a second terminal selectively coupled to a reference potential node of the ADC and selectively coupled to the first port.

3. The ADC of claim 2, wherein the ADC is configured to:
   couple the first capacitive element in parallel with a capacitive element associated with the second conversion stage during a conversion phase; and
   couple the first capacitive element between the input of the amplifier and the output of the amplifier during an amplification phase.

4. The ADC of claim 2, further comprising:
   a first switch coupled between the residue output of the first conversion stage and the input of the amplifier;
   a second switch coupled between the output of the amplifier and the second port of the switched-capacitor network;
   a third switch coupled between the first port of the switched-capacitor network and the second terminal of the first capacitive element; and
   a fourth switch coupled between the second terminal of the first capacitive element and the reference potential node.

5. The ADC of claim 4, wherein:
   during an amplification phase, the first switch, the second switch, and the third switch are configured to be closed and the fourth switch is configured to be open; and
   during a conversion phase, the fourth switch is configured to be closed and the first switch, the second switch, and the third switch are configured to be open.

6. The ADC of claim 2, wherein the switched-capacitor network further comprises a second capacitive element having a first terminal selectively coupled to the first port and selectively coupled to the reference potential node of the ADC and having a second terminal selectively coupled to the second port.

7. The ADC of claim 6, wherein the second terminal of the second capacitive element is selectively coupled to a third port of the switched-capacitor network.

8. The ADC of claim 6, further comprising:
   a first switch coupled between the first port of the switched-capacitor network and the first terminal of the second capacitive element;
   a second switch coupled between the first terminal of the second capacitive element and the reference potential node of the ADC; and
   a third switch coupled between the second terminal of the second capacitive element and the second port of the switched-capacitor network.

9. The ADC of claim 6, wherein the switched-capacitor network further comprises a third capacitive element having a first terminal selectively coupled to the first port and selectively coupled to the reference potential node of the ADC and having a second terminal selectively coupled to the second port.

10. The ADC of claim 9, wherein the second terminal of the third capacitive element is selectively coupled to a third port of the switched-capacitor network.

11. The ADC of claim 9, further comprising:
    a first switch coupled between the first port of the switched-capacitor network and the first terminal of the second capacitive element;
    a second switch coupled between the first terminal of the second capacitive element and the reference potential node of the ADC;
    a third switch coupled between the second terminal of the second capacitive element and the second port of the switched-capacitor network;
    a fourth switch coupled between the first port of the switched-capacitor network and the first terminal of the third capacitive element;
    a fifth switch coupled between the first terminal of the third capacitive element and the reference potential node of the ADC; and
    a sixth switch coupled between the second terminal of the third capacitive element and the second port of the switched-capacitor network.

12. The ADC of claim 11, wherein:
    during a first conversion phase, the second switch, the third switch, and the fifth switch are configured to be closed and the first switch, the fourth switch, and the sixth switch are configured to be open; and during a second conversion phase, the second switch, the fifth switch, and the sixth switch are configured to be closed and the first switch, the third switch, and the fourth switch are configured to be open.

13. The ADC of claim 1, wherein the second conversion stage is a last stage of the ADC.

14. The ADC of claim 1, wherein the ADC comprises a pipelined ADC.

15. An analog-to-digital converter (ADC) comprising:
a first conversion stage having a residue output;
an amplifier having an input selectively coupled to the residue output of the first conversion stage;
a second conversion stage having an input selectively coupled to an output of the amplifier; and
a switched-capacitor network having a first port coupled to the input of the amplifier and having a second port coupled to the input of the second conversion stage, the switched-capacitor network having a first capacitive element having a first terminal coupled to the second port and having a second terminal selectively coupled to a reference potential node of the ADC and selectively coupled to the first port.

16. The ADC of claim 15, wherein the ADC is configured to:
couple the first capacitive element in parallel with a capacitive element associated with the second conversion stage during a conversion phase; and
couple the first capacitive element between the input of the amplifier and the output of the amplifier during an amplification phase.

17. The ADC of claim 15, further comprising:
a first switch coupled between the residue output of the first conversion stage and the input of the amplifier;
a second switch coupled between the output of the amplifier and the second port of the switched-capacitor network;
a third switch coupled between the first port of the switched-capacitor network and the second terminal of the first capacitive element; and
a fourth switch coupled between the second terminal of the first capacitive element and the reference potential node.

18. The ADC of claim 17, wherein:
during an amplification phase, the first switch, the second switch, and the third switch are configured to be closed and the fourth switch is configured to be open; and
during a conversion phase, the fourth switch is configured to be closed and the first switch, the second switch, and the third switch are configured to be open.

19. The ADC of claim 15, wherein the switched-capacitor network further comprises a second capacitive element having a first terminal selectively coupled to the first port of the switched-capacitor network and selectively coupled to the reference potential node of the ADC and having a second terminal selectively coupled to the second port of the switched-capacitor network.

20. The ADC of claim 19, wherein the switched-capacitor network further comprises a third capacitive element having a first terminal selectively coupled to the first port of the switched-capacitor network and selectively coupled to the reference potential node of the ADC and having a second terminal selectively coupled to the second port of the switched-capacitor network.

21. The ADC of claim 15, wherein the second conversion stage is a last stage of the ADC.

22. The ADC of claim 15, wherein the ADC comprises a pipelined ADC.

23. A method of analog-to-digital conversion using an analog-to-digital converter (ADC) comprising a first conversion stage, a second conversion stage, an amplifier selectively coupled between the first conversion stage and the second conversion stage, and a switched-capacitor network coupled between an input of the amplifier and an input of the second conversion stage, the method comprising:
coupling, during a conversion phase of the ADC, a first capacitive element of the switched-capacitor network in parallel with a capacitive element associated with the second conversion stage; and
coupling, during an amplification phase of the ADC, the first capacitive element between the input of the amplifier and an output of the amplifier.

24. The method of claim 23, further comprising, during the conversion phase:
decoupling the input of the amplifier from a residue output of the first conversion stage, wherein coupling the first capacitive element in parallel with the capacitive element associated with the second conversion stage comprises coupling a terminal of the first capacitive element to a reference potential node of the ADC; and
decoupling the output of the amplifier from the switched-capacitor network and from the input of the second conversion stage.

25. The method of claim 24, further comprising, during the amplification phase:
coupling the input of the amplifier to the residue output of the first conversion stage, wherein coupling the first capacitive element between the input of the amplifier and an output of the amplifier comprises coupling the output of the amplifier to the switched-capacitor network and to the input of the second conversion stage; and
decoupling the terminal of the first capacitive element from the reference potential node of the ADC.

26. The method of claim 23, further comprising:
coupling, during every $n^{th}$ cycle of the conversion phase, where n is a positive integer, a second capacitive element of the switched-capacitor network in parallel with the first capacitive element and the capacitive element associated with the second conversion stage; and
coupling, during every $n^{th}$ cycle of the amplification phase, the second capacitive element between the input of the amplifier and the output of the amplifier, such that the second capacitive element is in parallel with the first capacitive element.

27. The method of claim 26, further comprising:
coupling, during a cycle after every $n^{th}$ cycle of the conversion phase, a third capacitive element of the switched-capacitor network in parallel with the first capacitive element and the capacitive element associated with the second conversion stage, wherein the second capacitive element is decoupled from the input of the second conversion stage during the cycle; and
coupling, during a cycle after every $n^{th}$ cycle of the amplification phase, the third capacitive element between the input of the amplifier and the output of the amplifier, such that the third capacitive element is in parallel with the first capacitive element, wherein the second capacitive element is decoupled from the input and the output of the amplifier during the cycle.

28. The method of claim 27, further comprising at least one of:
  reading out a residue voltage from the second capacitive element during the cycle after every $n^{th}$ cycle of the conversion phase; or
  reading out a residue voltage from the third capacitive element during every $n^{th}$ cycle of the conversion phase.

29. An analog-to-digital converter (ADC) comprising:
  first means for converting an analog input signal to a first digital output signal;
  means for amplifying a residue from the first means for converting;
  second means for converting the amplified residue to a second digital output signal; and
  means for providing a second-order or higher noise transfer function for noise shaping of quantization noise of the second means for converting.

* * * * *